(12) United States Patent
Ishihara et al.

(10) Patent No.: US 9,277,655 B2
(45) Date of Patent: *Mar. 1, 2016

(54) COMBINED WIRING BOARD AND METHOD FOR MANUFACTURING THE SAME

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/542,721

(22) Filed: Nov. 17, 2014

(65) Prior Publication Data

US 2015/0136453 A1   May 21, 2015

(30) Foreign Application Priority Data

Nov. 15, 2013  (JP) ................................. 2013-236518

(51) Int. Cl.
  H05K 1/11  (2006.01)
  H05K 3/36  (2006.01)
  H05K 1/14  (2006.01)
  H05K 1/02  (2006.01)

(52) U.S. Cl.
  CPC .............. *H05K 3/368* (2013.01); *H05K 1/0271* (2013.01); *H05K 1/142* (2013.01); *H05K 1/144* (2013.01); *H05K 2201/2018* (2013.01); *H05K 2201/2072* (2013.01); *Y10T 29/49126* (2015.01)

(58) Field of Classification Search
  USPC ........................... 361/792, 784; 174/255, 250
  See application file for complete search history.

(56) References Cited

U.S. PATENT DOCUMENTS 8,259,467 B2 * 9/2012 Hasegawa ............ H05K 3/0052
                                                                        361/792
2014/0345664 A1 * 11/2014 Meyer .................. C04B 37/021
                                                                        136/205

FOREIGN PATENT DOCUMENTS

JP        2011-023657 A        2/2011

OTHER PUBLICATIONS

U.S. Appl. No. 14/542,753, filed Nov. 17, 2014, Ishihara et al.
U.S. Appl. No. 14/496,028, filed Sep. 25, 2014, Ishihara et al.
U.S. Appl. No. 14/492,424, filed Sep. 22, 2014, Ishihara et al.

* cited by examiner

*Primary Examiner* — Andargie M Aychillhum
(74) *Attorney, Agent, or Firm* — Oblon, McClelland, Maier & Neustadt, L.L.P.

(57) ABSTRACT

A combined wiring board includes a wiring board set having multiple wiring boards and one or more adhesive agent portions such that the wiring boards are connected each other by the adhesive agent portion or adhesive agent portions, and a metal frame having an accommodation opening portion formed to accommodate the wiring board set such that the wiring board set is positioned in the accommodation opening portion of the metal frame.

15 Claims, 18 Drawing Sheets

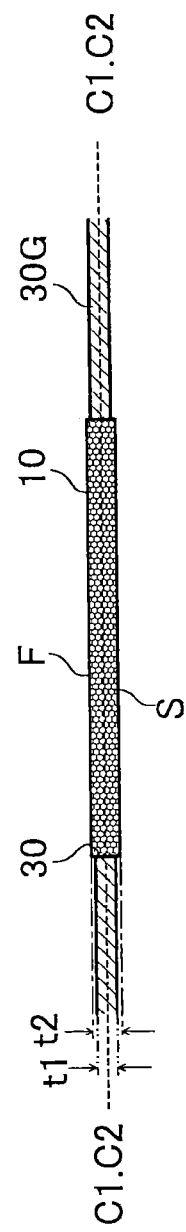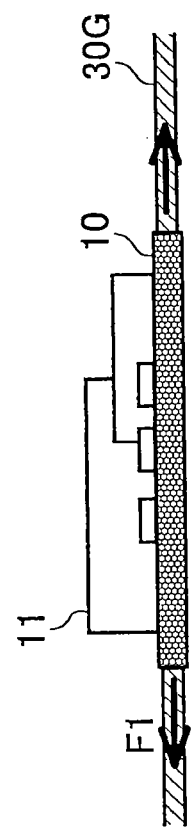

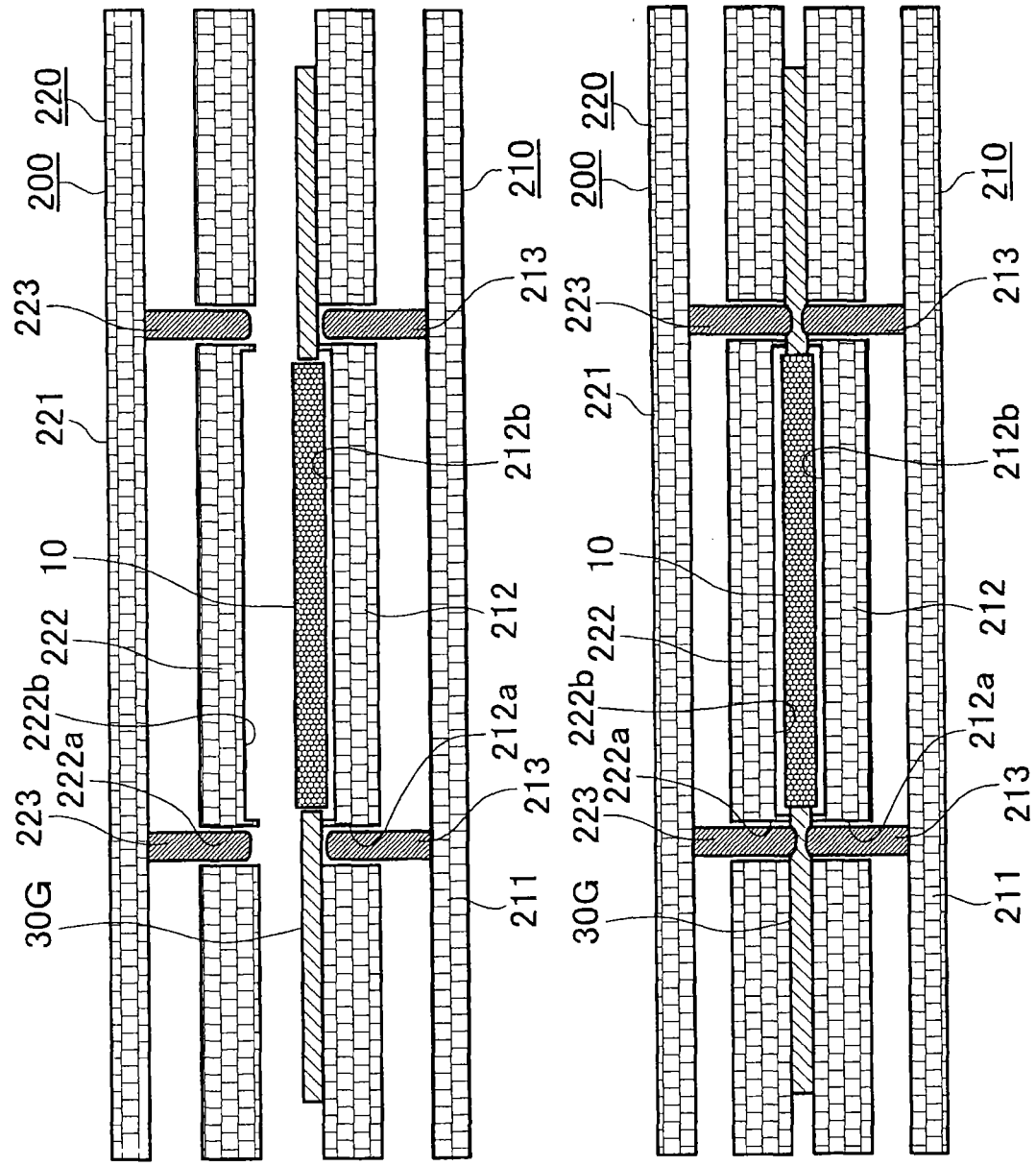

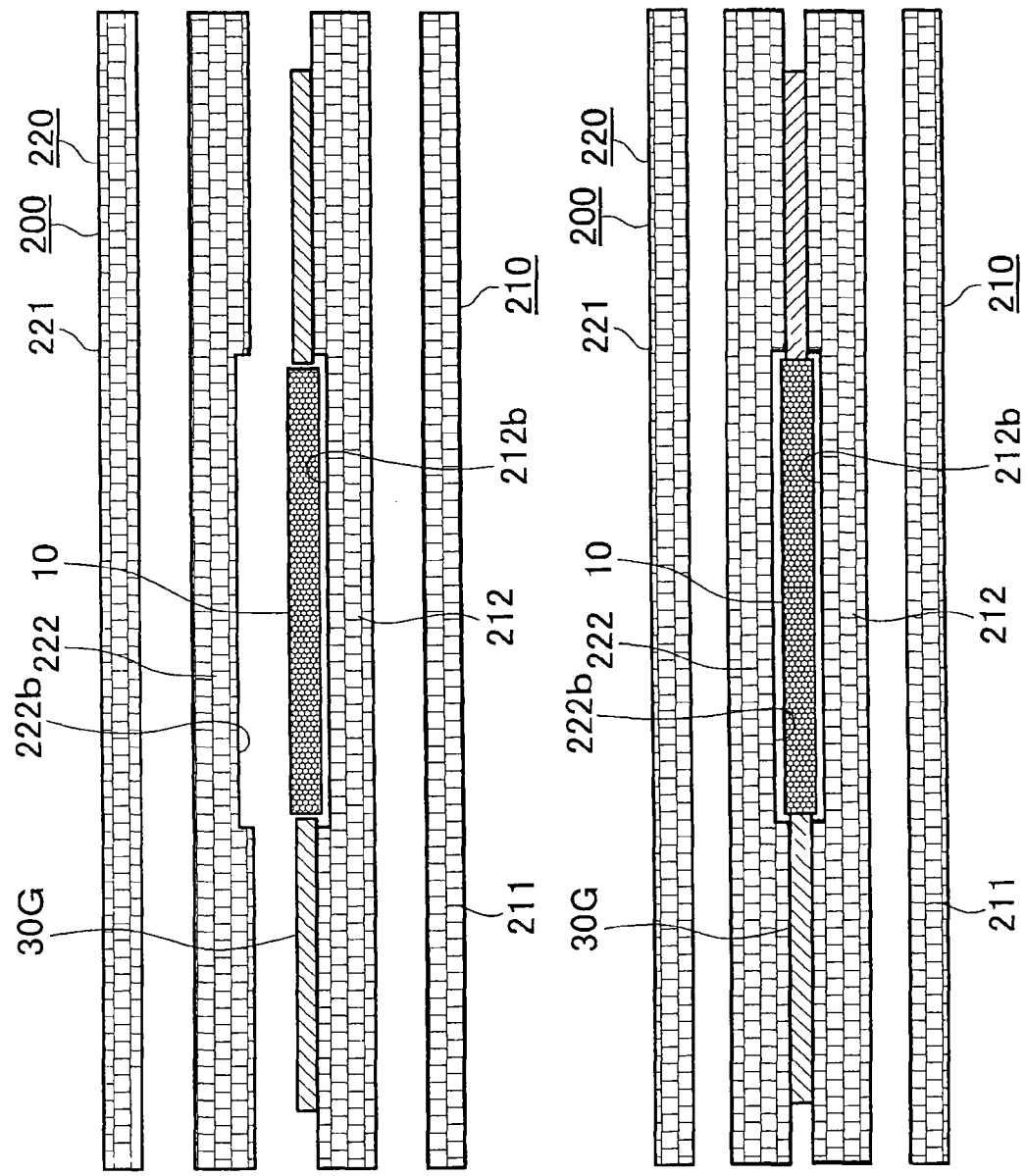

COMBINED WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-236518, filed Nov. 15, 2013, the entire contents of which are incorporated herein by reference.

BACKGROUND OF THE INVENTION

1. Field of the Invention

The present invention relates to a combined wiring board where multiple wiring boards to be reflowed are fixed to a metal frame.

2. Description of Background Art

When mounting an electronic component on a wiring board and conducting other procedures on the wiring board, such procedures may be performed not on one single wiring board but on a combined wiring board where multiple identical wiring boards are accommodated in an accommodation kit. JP2011-23657A describes a multipiece wiring-board accommodation kit made up of multiple piece wiring boards and a frame having accommodation holes to accommodate the piece wiring boards. The entire contents of this publication are incorporated herein by reference.

SUMMARY OF THE INVENTION

According to one aspect of the present invention, a combined wiring board includes a wiring board set having multiple wiring boards and one or more adhesive agent portions such that the wiring boards are connected each other by the adhesive agent portion or adhesive agent portions, and a metal frame having an accommodation opening portion formed to accommodate the wiring board set such that the wiring board set is positioned in the accommodation opening portion of the metal frame.

According to another aspect of the present invention, a method for manufacturing a combined wiring board includes preparing a wiring board set having multiple wiring boards and one or more adhesive agent portions connecting the wiring boards each other, accommodating the wiring board set in an accommodation opening portion formed in a metal frame such that the wiring board set is positioned in the accommodation opening portion of the metal frame, and fixing the wiring board set positioned in the accommodation opening portion of the metal frame to the metal frame.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 7(A) and 7(B) are cross-sectional views showing part of a combined wiring board;

FIGS. 8(A) and 8(B) are cross-sectional views of a crimping tool in a first embodiment;

FIGS. 9(A) and 9(B) are cross-sectional views of a crimping tool in a first modified example of the first embodiment;

DETAILED DESCRIPTION OF THE EMBODIMENTS

Figure 1:
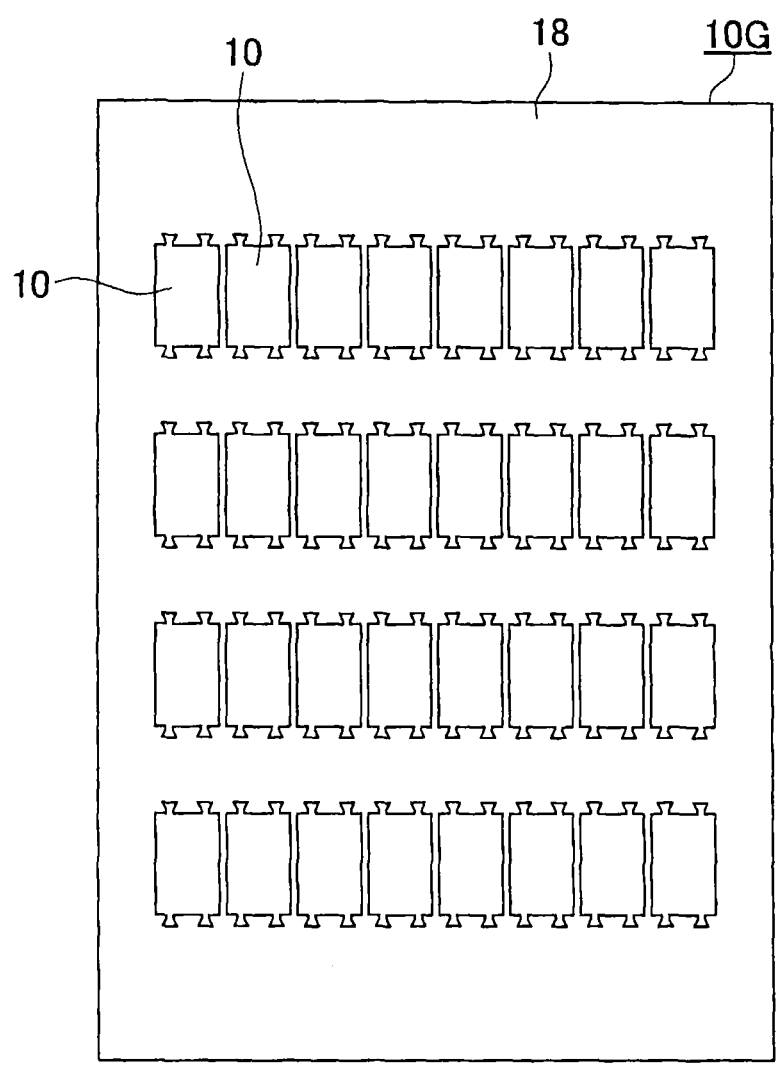
FIG. 1 is a plan view of a multipiece printed wiring board.

The embodiments will now be described with reference to the accompanying drawings, wherein like reference numerals designate corresponding or identical elements throughout the various drawings.

First Embodiment

In combined wiring board 100 of the present embodiment, multiple wiring boards to be reflowed are fixed to metal frame (30G) so as to prevent warping in each wiring board in a reflow process or the like for mounting an electronic component.

Figure 11:
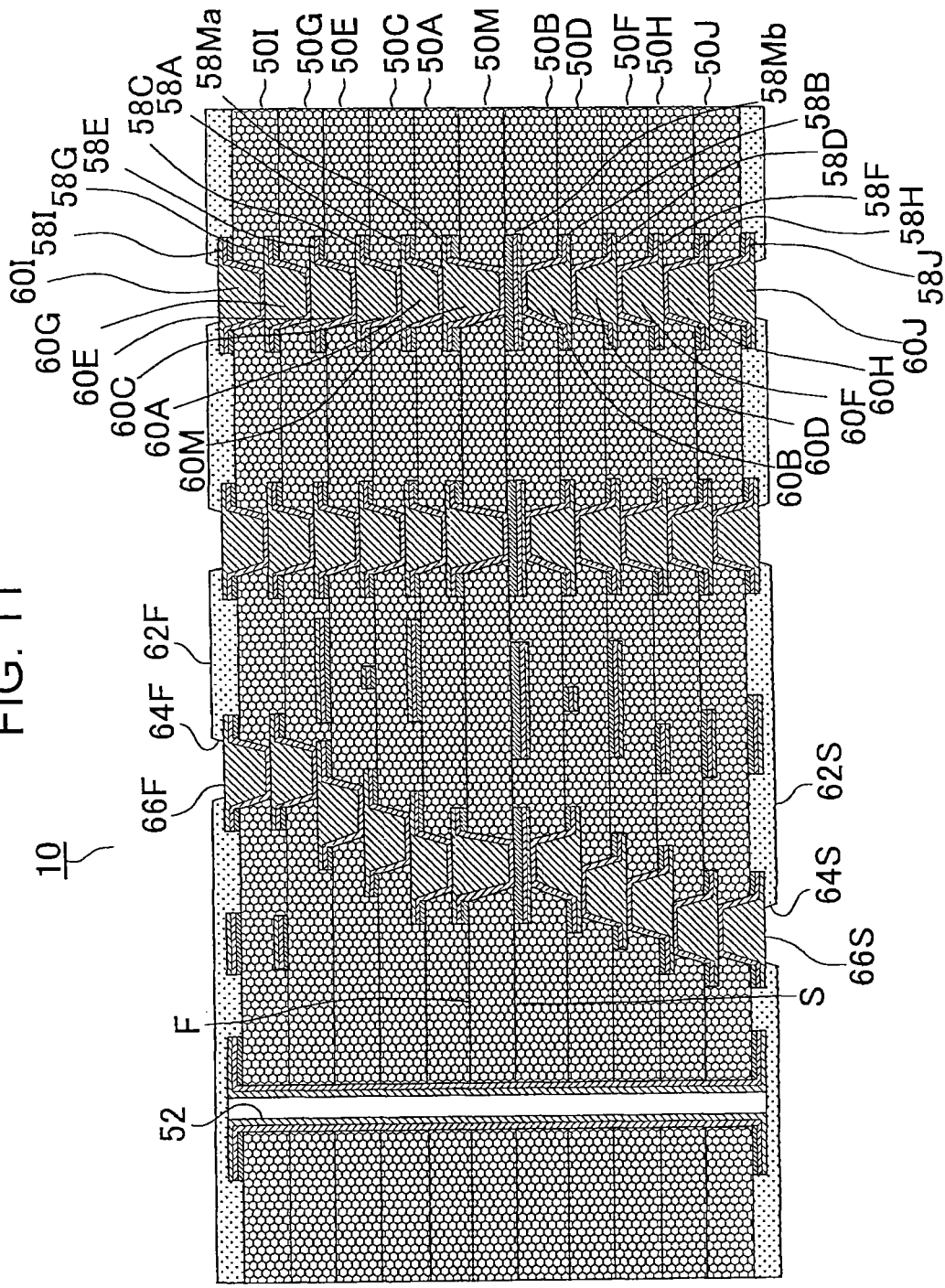
FIG. 11 is a cross-sectional view of a printed wiring board of the first embodiment.

FIG. 11 is a cross-sectional view of printed wiring board 10 of the first embodiment before an electronic component is mounted. In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) is connected to conductive circuit (58Mb) on second surface (S) by via conductor (60M). A core material is provided in core insulation layer (50M) and a core material is also provided in each of interlayer insulation layers (50A, 50C, 50E, 50G, 50I) and interlayer insulation layers (50B, 50D, 50F, 50H, 50J).

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) of core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G). Solder-resist layer (62F) is formed on interlayer insulation layer (50I), and conductive circuit (58I) exposed from opening (64F) of the solder-resist layer works as pad (66F).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) of core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H). Solder-resist layer (62S) is formed on interlayer insulation layer (50J), and conductive circuit (58J) exposed from opening (64S) of the solder-resist layer works as pad (66S). Through hole 52 is formed penetrating through interlayer insulation layers (50I, 50G, 50E, 50C, 50A, 50M, 50B, 50D, 50F, 50H, 50J).

Figure 12:
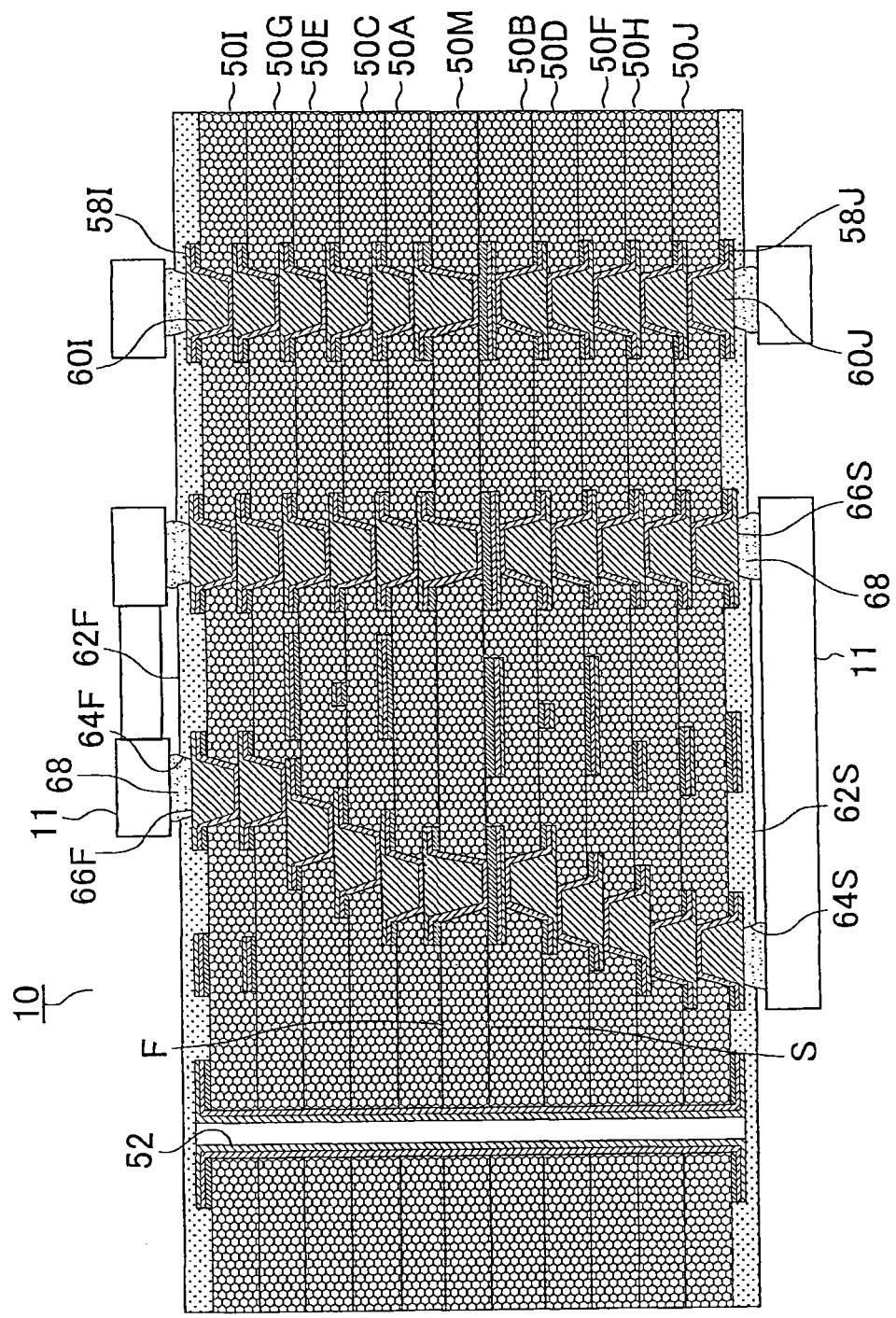
FIG. 12 is a cross-sectional view of a printed wiring board with mounted electronic components in the first embodiment.

FIG. 12 is a cross-sectional view of printed wiring board 10 with mounted electronic components 11. On the first-surface (F) side of printed wiring board 10, electronic component 11 is mounted through solder 68 provided on pad (66F), and on the second-surface (S) side of printed wiring board 10, electronic component 11 is mounted through solder 68 provided on pad (66S).

Figure 2:
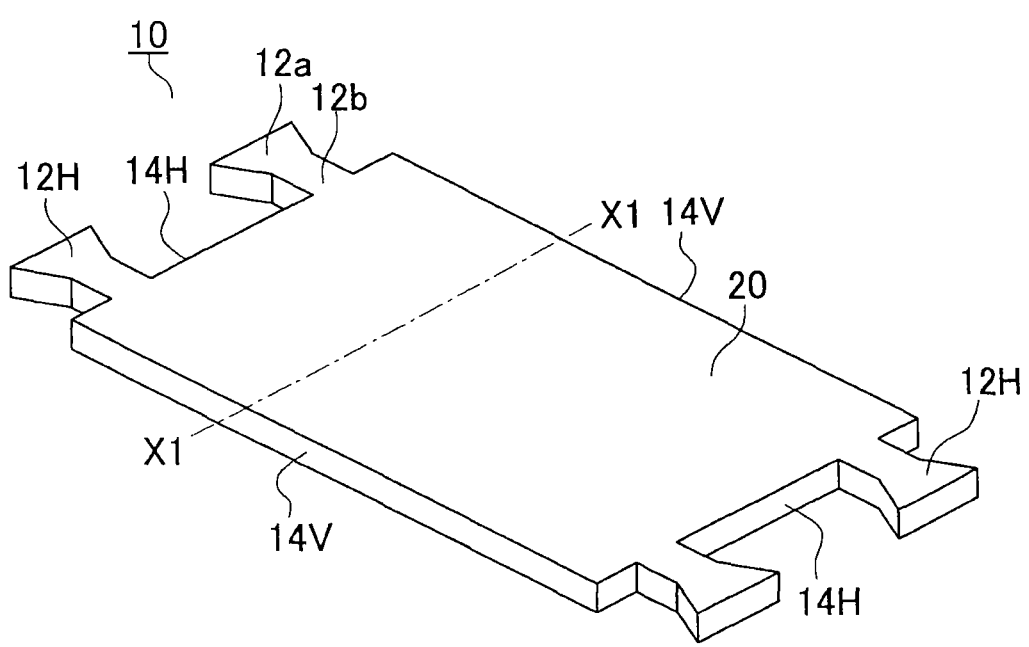
FIG. 2 is a perspective view of an individually cut-out printed wiring board.

FIG. 1 is a plan view of multipiece printed wiring board (10G) where 8×4 printed wiring boards 10 are manufactured. FIG. 2 is a perspective view of printed wiring board 10 cut out into an individual piece. FIG. 11 shows part of the cross section taken at (X1-X1) in FIG. 2. As shown in FIG. 1, multiple printed wiring boards 10 are manufactured inside frame 18 positioned along the periphery of multipiece printed wiring board (10G). As shown in FIG. 2, printed wiring board 10 has rectangular main body 20 structured to have short-side sidewalls (14H) and long-side sidewalls (14V). To each of short-side sidewalls (14H) of main body 20, two support pieces (12H) are attached opposite each other to sandwich main body 20. Support piece (12H) is made up of rectangular base portion (bridge portion) (12b) and trapezoidal portion (12a) with a width that increases toward its tip.

Figure 3A:
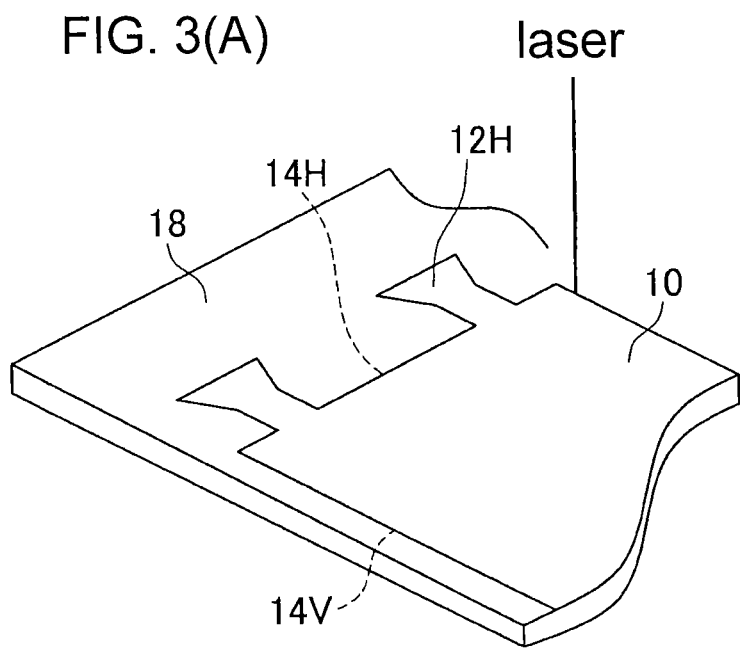
FIGS. 3(A) and 3(B) are perspective views of a printed wiring board being processed by a laser.
Figure 3B:
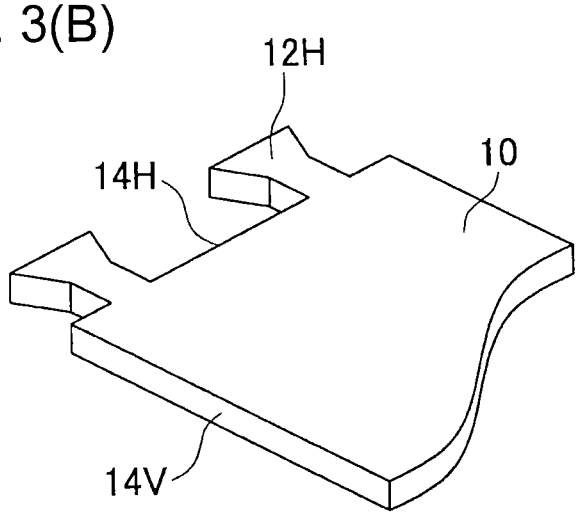

In the first embodiment, when printed wiring board 10 is cut out from multipiece wiring board (10G), a laser is used to cut along the outline of printed wiring board 10 as shown in FIG. 3(A) and an individual piece is cut out as shown in FIG. 3(B).

Figure 4A:
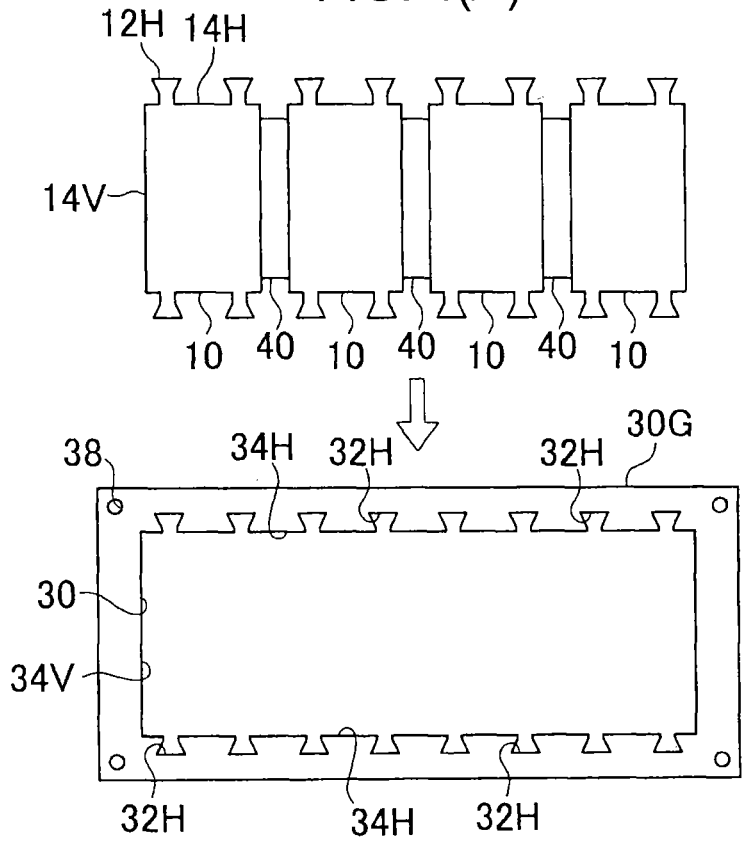
FIG. 4(A) is a plan view of a metal frame.
Figure 4B:
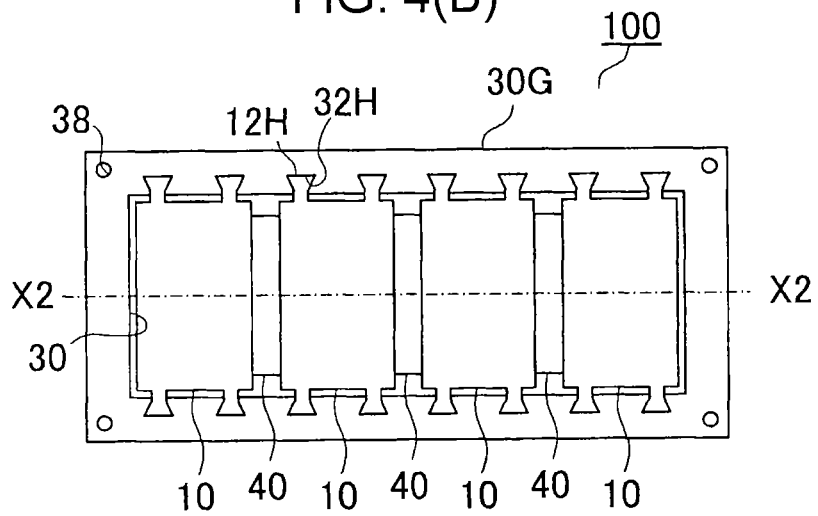
FIG. 4(B) is a plan view of a combined wiring board.
Figure 5:
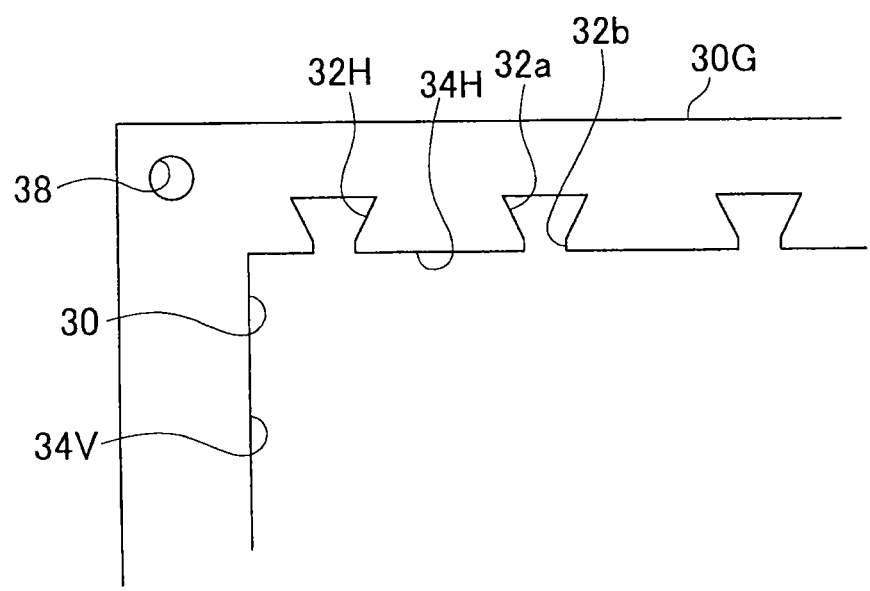
FIG. 5 is an enlarged plan view showing part of a metal frame.

FIG. 4(A) shows a plan view of metal frame (30G), and FIG. 4(B) shows a state where printed wiring boards 10 are each accommodated in opening 30 of metal frame (30G). FIG. 5 is an enlarged plan view showing part of metal frame (30G). As shown in FIG. 4(A), a set of four printed wiring boards 10 that are connected to each other by adhesive agent 40 is accommodated in opening 30 of metal frame (30G).

Metal frame (30G) has accommodation opening 30 to accommodate printed wiring boards 10, and has alignment holes 38 on its four corners. In accommodation opening 30, horizontal walls (34H) and vertical walls (34V) are formed: horizontal wall (34H) is formed to face short-side sidewall (14H) of each of connected printed wiring boards 10 with a predetermined clearance disposed between them; and vertical wall (34V) is formed to face long-side sidewall (14V) of the printed wiring board positioned on either end where a predetermined clearance is disposed between them. In addition, along horizontal wall (34H), slits (32H) are formed for support pieces (12H) of connected printed wiring boards to be inserted and supported.

FIG. 5 is an enlarged view of slit (32H). Slit (32H) is made up of base portion (32b) corresponding to rectangular base portion (bridge portion) (12b) of support piece (12H) and trapezoidal portion (32a) corresponding to trapezoidal portion (12a) of support piece (12H) of printed wiring board 10. The width of trapezoidal portion (32a) increases toward the periphery of accommodation opening 30.

As shown in FIG. 4(B), printed wiring boards 10 connected to each other are accommodated in metal frame (30G) by their respective support pieces (12H) supported by slits (32H) formed in accommodation opening 30.

Figure 6:
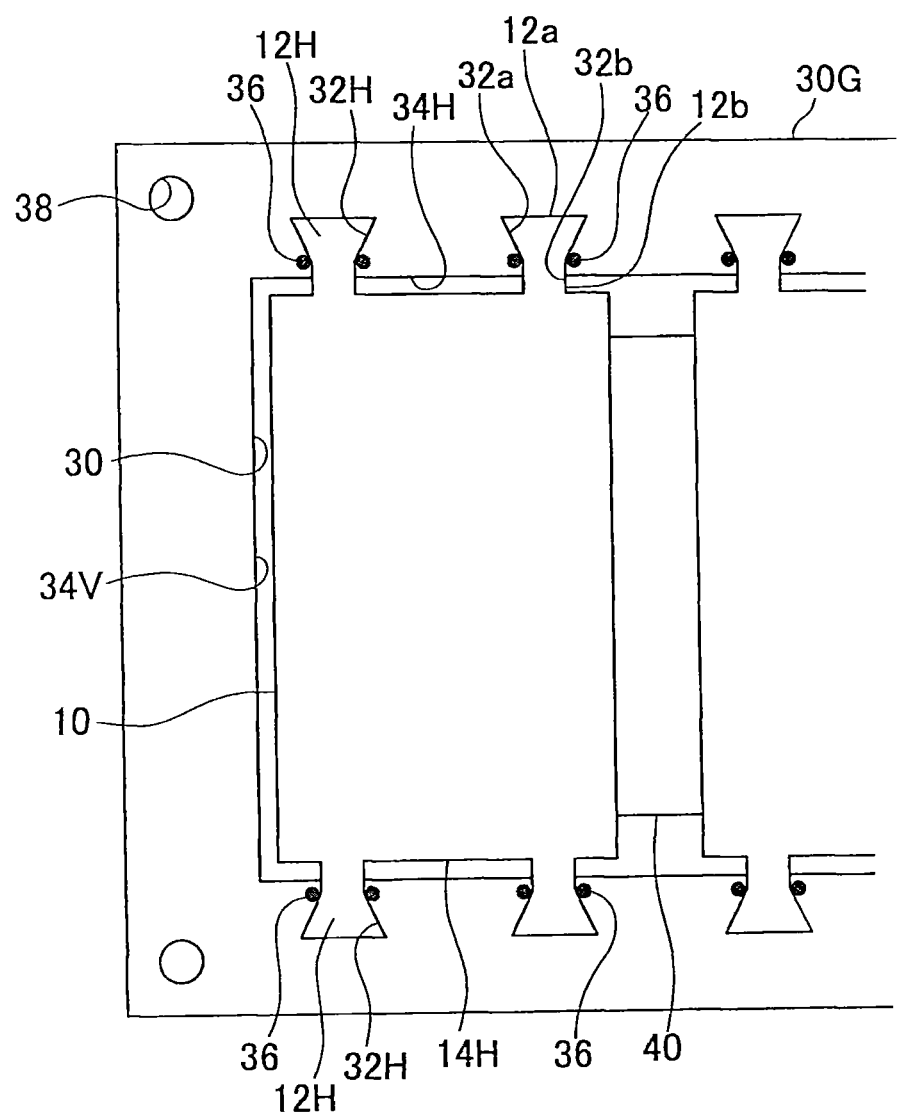
FIG. 6 is a plan view of a crimped printed wiring board.

FIG. 6 shows a state where each printed wiring board 10 is fixed to accommodation opening 30 of metal frame (30G) through a crimping process. As shown in FIG. 6, each crimped portion 36 is formed using crimping tool 200 at a position which is a border between base portion (32b) and trapezoidal portion (32a) of slit (32H) and which is adjacent to support piece (12H). Crimped portion 36 causes the sidewall of slit (32H) to abut the sidewall of slit (12H) and to undergo plastic deformation so as to be bonded with the sidewall of support piece (12H). Accordingly, each printed wiring board 10 is fixed to metal frame (30G).

FIG. 7(A) shows part of the cross section taken at (X2-X2) of printed wiring board 10 shown in FIG. 4(B). Metal frame (30G) is set to have a thickness (t1) of 750 μm, and printed wiring board 10 is set to have a thickness (t2) of 780 μm. Namely, the thickness of metal frame (30G) is less than that of printed wiring board 10. Also, as shown in FIG. 7(A), printed wiring board 10 is fixed to metal frame (30G) in such a way that its center plane (C2) in a thickness direction corresponds to center plane (C1) of metal frame (30G) in the thickness direction. Therefore, metal frame (30G) is recessed from upper surface (first surface) (F) of printed wiring board 10, and metal frame (30G) is recessed from lower surface (second surface) (S) of printed wiring board (10). Accordingly, interference by frame (30G) is avoided when an electronic component is mounted on printed wiring board 10.

The coefficient of thermal expansion along a main surface of metal frame (30G) made of aluminum is 23 ppm/° C., and the coefficient of thermal expansion along a main surface of printed wiring board 10 made of resin is 16 ppm/° C. The thermal expansion coefficient of metal frame (30G) is higher than that of printed wiring board 10. The thickness of metal frame (30G) is set to be less than that of printed wiring board (10) so that a difference in thermal expansion coefficients is adjusted to suppress warping in printed wiring board 10. In the first embodiment, aluminum was used for forming metal frame (30G). However, any other material such as copper or stainless steel may be used as long as the material has a higher thermal expansion coefficient than printed wiring board 10.

FIG. 8(A) is a cross-sectional view of crimping tool 200 to conduct a crimping process on printed wiring board 10. Crimping tool 200 is a machine having lower die 210 and upper die 220, and conducts a crimping process on each printed wiring board 10 that is accommodated in opening 30 by being supported by support piece (12H). Lower die 210 has base portion 211 and support plate 212. Support plate 212 is supported to be vertically movable with respect to base portion 211. Punches 213 for crimping are provided for base portion 211, and penetrating holes (212a) for punches 213 to pass through are formed in support plate 212. In the central portion of support plate 212, recessed portion (212b) is formed so as not to exert force on printed wiring board 10 during crimping. Printed wiring board 10 is placed on recessed portion (212b), and metal frame (30G) is placed on support plate 212.

Upper die 220 has base portion 221 and support plate 222. Support plate 222 is supported to be vertically movable with respect to base portion 221. Punches 223 for crimping are provided for base portion 221, and penetrating holes (222a) for punches 223 to pass through are formed in support plate 222. Recessed portion (222b) is formed in the central portion of support plate 222 so that force will not be exerted on printed wiring board 10 during printing.

FIG. 8(B) is a view showing a state where upper die 220 is pressed against lower die 210, punches 223 of upper die 220 are pressed against the upper surface of metal frame (30G), and punches 213 of lower die 210 are pressed against the lower surface of metal frame (30G).

Using crimping tool 200, each crimped portion 36 shown in FIG. 6 is simultaneously formed in metal frame (30G) prepared as shown in FIG. 4(B). Because of crimped portions 36 formed as above, each printed wiring board 10 is fixed to metal frame (30G). Accordingly, combined wiring board 100 made up of printed wiring boards 10 and metal frame (30G) is completed to be ready for a reflow process.

In combined wiring board 100 of the first embodiment, since printed wiring boards 10 are connected to each other and are accommodated in and fixed to metal frame (30G), it is easier to suppress warping in printed wiring boards 10 by using a difference in the thermal expansion coefficients between printed wiring boards 10 and metal frame (30G). Also, the bonding process of each printed wiring board 10 to metal frame (30G) is conducted more efficiently. Especially, since wiring boards 10 are fixed to the frame while they are connected to each other by adhesive agent 40, such a connected form of wiring boards 10 reduces variations in warping caused by the positional difference of each wiring board 10 in combined wiring board 100 (for example, a position at an edge or in the center). Thus, compared with a structure where each wiring board 10 is individually fixed to metal frame (30G), differences in the effects of warping reduction are minimized. Moreover, the number of printed wiring boards 10 in combined wiring board 100 is freely modified by changing the number of printed wiring boards 10 to be connected.

FIG. 9 is a cross-sectional view of crimping tool 200 according to a first modified example of the first embodiment. Punches are not used in the first modified example. Instead, by using support plate 222 of upper die 220 and support plate 212 of lower die 210, the entire metal frame (30G) undergoes plastic deformation so that printed wiring boards 10 are fixed to metal frame (30G).

After printed wiring boards 10 are each fixed to accommodation opening 30 of metal frame (30G) through crimping (see FIG. 6), solder printing is conducted, electronic components 11 or the like are positioned, and electronic components 11 or the like are mounted in a reflow oven. Since a reflow temperature approaching 200° C. exceeds the glass transition temperature (Tg) of resin used in printed wiring board 10, printed wiring board 10 tends to warp due to the weight of mounted electronic component 11 or the like and residual stress in the wiring board. As shown in FIG. 7(B), stress toward the center of printed wiring board 10 is generated together with stress from the weight of electronic component 11 or the like in printed wiring board 10 of the first embodiment fixed to metal frame (30G). However, since the coefficient of thermal expansion along a main surface of metal frame (30G) is higher than that of printed wiring board 10 as described above, metal frame (30G) expands in planar directions to a greater degree than the expansion of printed wiring board 10. Thus, on printed wiring board 10 fixed into accommodation opening 30, stress (F1) toward the periphery is exerted so as to cancel out the aforementioned stress toward the center of printed wiring board 10. Accordingly, warping is unlikely to occur in printed wiring board 10 during the reflow process.

Printed wiring board 10 according to the first modified example of the first embodiment has the structure shown in FIG. 12, and core material is provided to core insulation layer (50M) while no core material is provided in interlayer insulation layers (50A, 50C, 50E, 50G 50I) or in interlayer insulation layers (50B, 50D, 50F, 50H, 50J). Thus, warping tends to occur in printed wiring board 10, but such warping is suppressed by metal frame (30G) so that warping is unlikely to occur in a reflow process.

Figure 10:
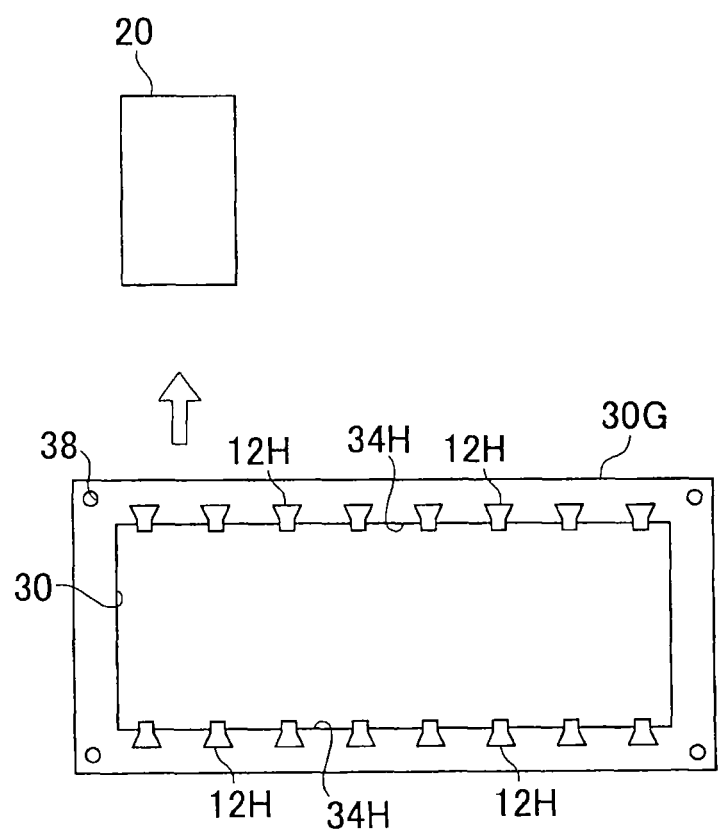
FIG. 10 is a plan view of a printed wiring board cut out from the combined wiring board.

After an electronic component is mounted, rectangular main body 20 is cut out from support pieces (12H) of printed wiring board 10 and adhesive agent 40 is removed so as to disconnect printed wiring boards from each other, as shown in FIG. 10. As a result, main body 20 of printed wiring board 10 is separated from metal frame (30G) while support pieces (12H) are left behind in slits (32H) of accommodation opening 30.

Second Modified Example of First Embodiment

Figure 13:
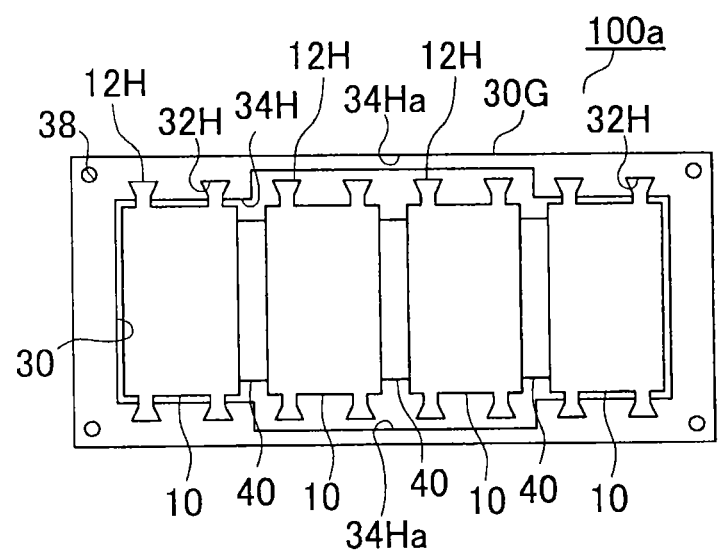
FIG. 13 is a plan view of a combined wiring board according to a second modified example of the first embodiment.

FIG. 13 shows combined wiring board (100a) according to a second modified example of the first embodiment.

In the second modified example, recess (34Ha) is formed in horizontal wall (34H) of opening 30 of metal frame (30G). As shown in FIG. 13, recess (34Ha) is formed to avoid contact with support pieces (12H) of connected printed wiring boards 10 excluding printed wiring boards 10 positioned at both ends.

Among all connected printed wiring boards 10, only such a support piece (12H) that belongs to a printed wiring board positioned at either of both ends is inserted into slit (32H) in the second modified example of the first embodiment. Compared with a structure where support pieces (12H) of all connected printed wiring boards 10 are inserted into slits (32H), each printed wiring board 10 is bonded to metal frame (30G) in a more efficient process. Here, recess (34Ha) is structured to avoid contact with support pieces (12H) of printed wiring boards 10 excluding those positioned at both ends. However, that is not the only option. Recess (34Ha) may also be structured to avoid contact with part of support pieces (12H) of printed wiring boards 10 connected to each other.

Third Modified Example of First Embodiment

Figure 14:
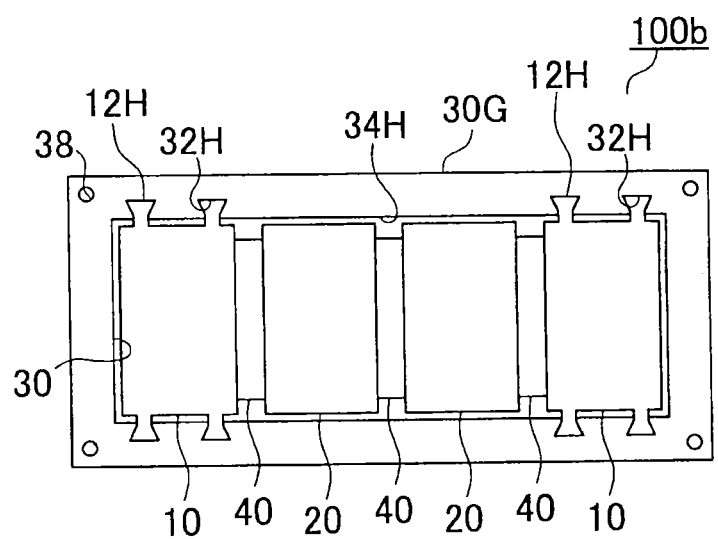
FIG. 14 is a plan view of a combined wiring board according to a third modified example of the first embodiment.

FIG. 14 shows combined wiring board (100b) according to a third modified example of the first embodiment.

In the third modified example, among multiple printed wiring boards connected to each other by adhesive agent 40, printed wiring boards excluding those positioned at both ends are each formed only with a main body 20 that does not have support piece (12H). In addition, in the portion of metal frame (30G) corresponding to a printed wiring board formed only with main body 20, slit (32H) is not formed in horizontal wall (34H) of opening 30.

Among all the connected printed wiring boards, only such a support piece (12H) that belongs to a printed wiring board positioned at either of both ends is inserted into slit (32H) in the third modified example of the first embodiment. Accordingly, each printed wiring board 10 is fixed to metal frame (30G) in a more efficient process, the same as in the second modified example described above. Here, slit (32H) may also be formed in a portion of horizontal wall (34H) corresponding to a printed wiring board having only main body 20. In addition, among multiple printed wiring boards connected to each other by adhesive agent 40, if at least two printed wiring boards are formed to have a structure where their support pieces (12H) are inserted into slits (32H), remaining printed wiring boards may each be formed only with main body 20.

Fourth Modified Example of First Embodiment

Figure 15:
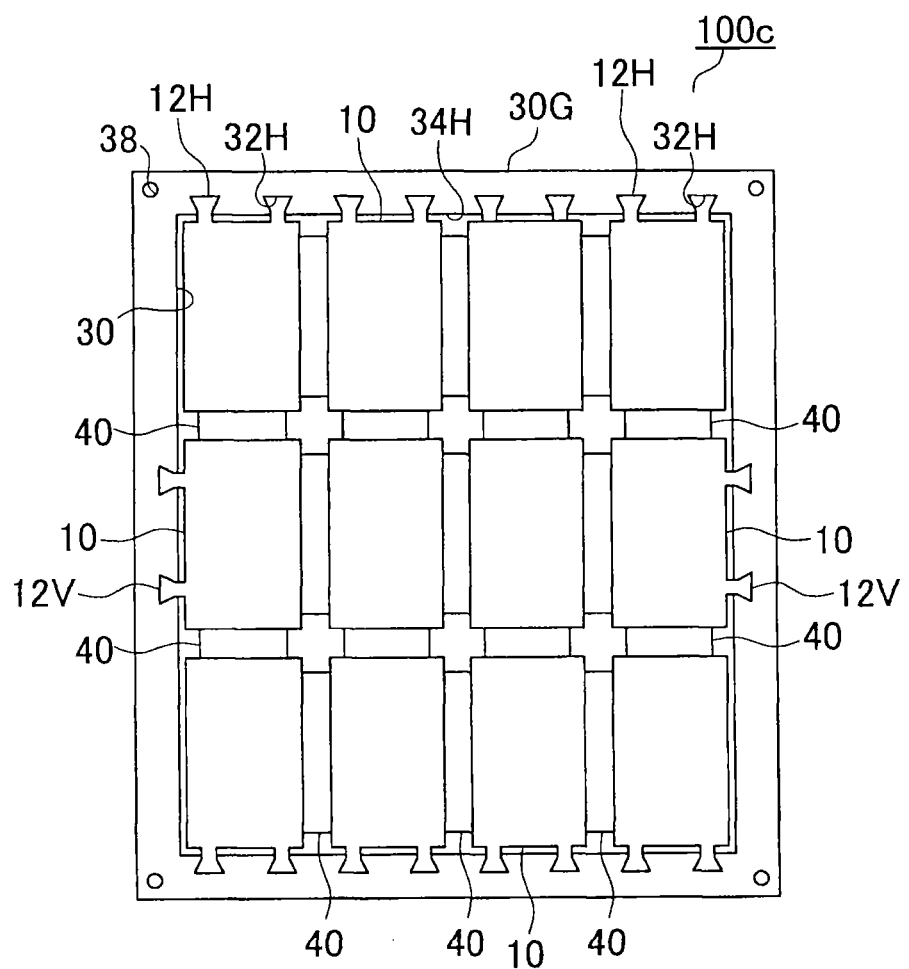
FIG. 15 is a plan view of a combined wiring board according to a fourth modified example of the first embodiment.

FIG. 15 shows combined wiring board (100c) according to a fourth modified example of the first embodiment.

In the fourth modified example, printed wiring boards 10 are connected to each other in a 2D layout using adhesive agent 40 as shown in FIG. 15, and are accommodated in opening 30 of metal frame (30G) by using support pieces (12H) and (12V). Printed wiring boards 10 positioned along the periphery of the layout have either support pieces (12H) formed along short-side sidewall (14H) or support pieces (12V) formed along long-side sidewall (14V). Using the structure of the fourth embodiment, more wiring boards 10 are fixed to the metal frame in a limited space.

Fifth Modified Example of First Embodiment

Figure 16:
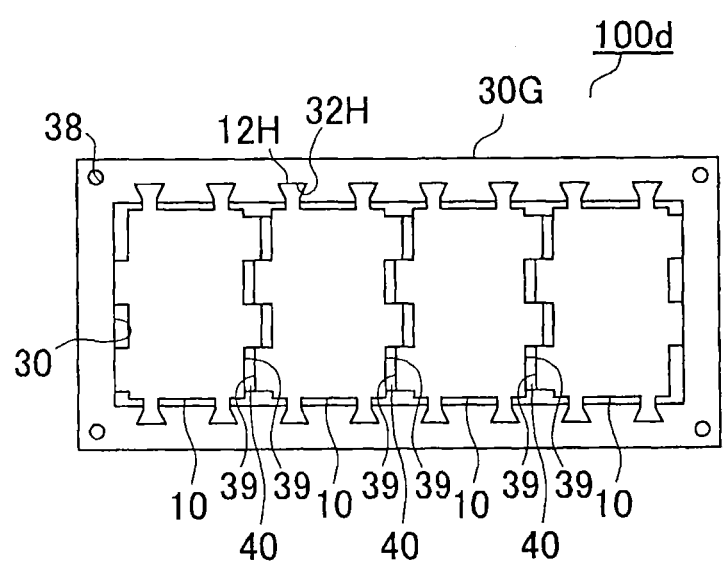
FIG. 16 is a plan view of a combined wiring board according to a fifth modified example of the first embodiment.

FIG. 16 shows combined wiring board (100d) according to a fifth modified example of the first embodiment.

In the fifth modified example, concavo-convex coupling portion 39 is provided to a sidewall of each printed wiring board 10. Printed wiring boards 10 are connected to each other by engaging coupling portions 39 and then by using adhesive agent 40 as shown in FIG. 16. Warping is also less likely to occur in printed wiring boards 10 structured according to the fifth modified example of the first embodiment.

Sixth Modified Example of First Embodiment

Figure 17A:
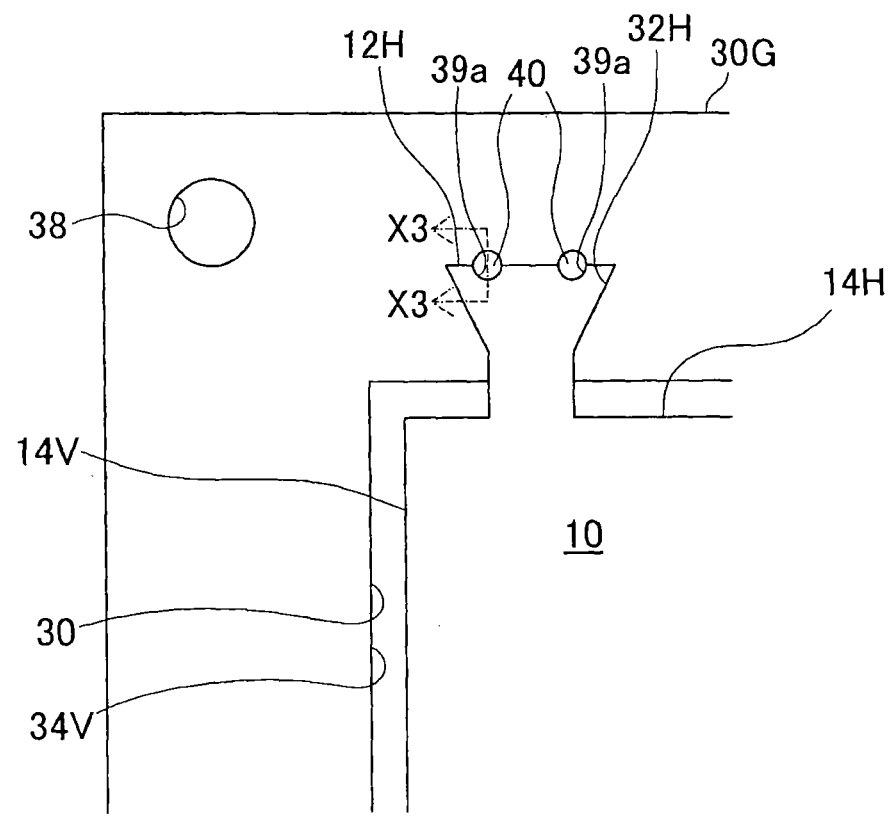
FIGS. 17(A) and 17(B) are views showing a main portion of a combined wiring board according to a sixth modified example of the first embodiment.
Figure 17B:
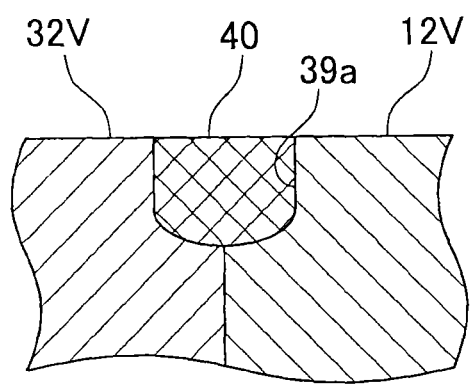

FIG. 17(A) is an enlarged view showing part of metal frame (30G) according to a sixth modified example of the first embodiment, and FIG. 17(B) shows part of the cross section taken at (X3-X3) near support piece (12H) in FIG. 17(A).

In the sixth modified example, as shown in FIG. 17(A), bottomed hole (39a) is formed to bridge both slit (32H) of metal frame (30G) and support piece (12H) of printed wiring board 10 (see FIG. 17(B)), and adhesive agent 40 is filled in each hole (39a). In the sixth modified example of the first embodiment, unsteady loose settings are prevented in each printed wiring board 10 accommodated in opening 30 of metal frame (30G).

Second Embodiment

Figure 18A:
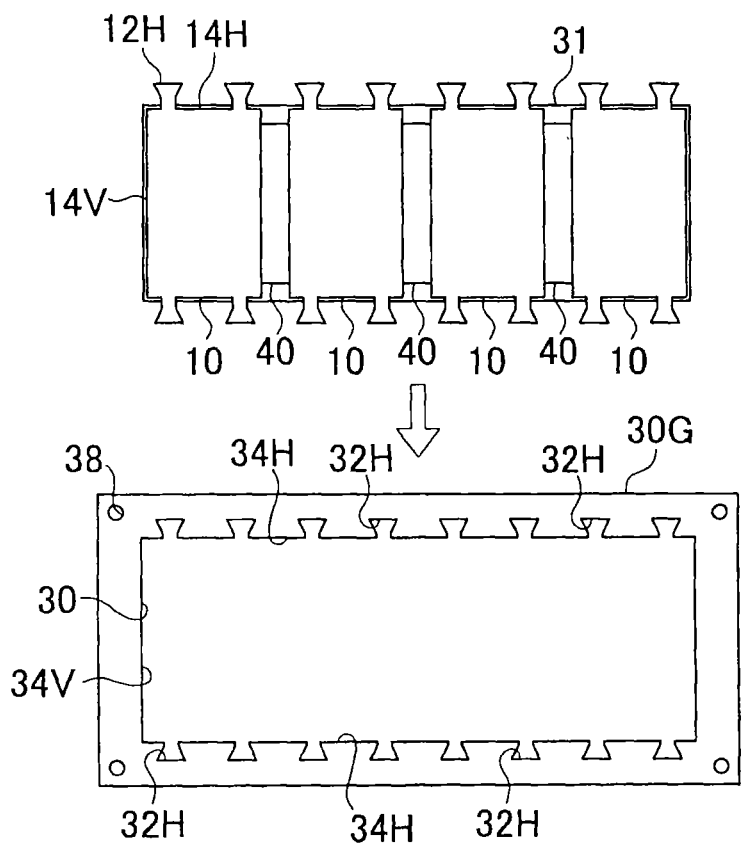
FIGS. 18(A) and 18(B) are plan views of a combined wiring board according to a second embodiment.
Figure 18B:
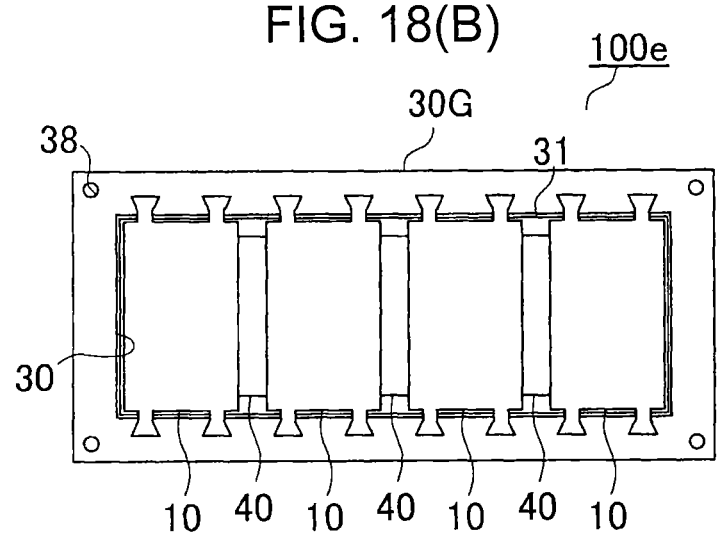

FIG. 18 shows combined wiring board (100e) according to a second embodiment: FIG. 18(A) is a plan view showing printed wiring boards 10 connected to each other after their positions are determined by alignment member 31; and FIG. 18(B) shows a state where printed wiring boards 10 are accommodated in opening 30 of metal frame (30G).

In combined wiring board (100e) of the second embodiment, printed wiring boards 10 are each positioned using alignment member 31, and then are connected to each other by adhesive agent 40 as shown in FIG. 18(A). Printed wiring board 10 is positioned using alignment member 31 by, for example, inserting an alignment pin formed in planar alignment member 31 through a pin-insertion hole formed in each printed wiring board 10. Then, printed wiring boards 10 positioned as above and connected to each other by adhesive agent 40 are accommodated in opening 30 and fixed to metal frame (30G) through a crimping process.

In combined wiring board (100e) of the second embodiment, printed wiring boards 10 are each positioned by alignment member 31 and connected to each other by adhesive agent 40. Thus, in addition to the effects achieved in the first embodiment above, relative positioning accuracy of each printed wiring board 10 is enhanced.

The specific structure, where printed wiring boards 10 are each positioned using alignment member 31 and then connected to each other by adhesive agent 40 as described in the second embodiment, may also apply to a combined wiring board in each modified example of the first embodiment.

The above-described embodiments showed four connected printed wiring boards 10 that are fixed to metal frame (30G). However, that is not the only option, and two, three or five or more printed wiring boards 10 may be fixed to the metal frame by being connected to each other using adhesive agent 40. In addition, the metal section made of metal frame (30G) or the like is preferred to exhibit higher rigidity at a solder reflow temperature than the piece section made up of printed wiring board 10 or the like.

In a process for mounting an electronic component on a wiring board, the reflow temperature of solder exceeds the glass transition temperature (Tg) of the material used in the wiring board. Accordingly, caused by the weight of the mounted electronic component and the residual stress in the wiring board, warping may occur in the wiring board.

A combined wiring board according to an embodiment of the present invention prevents a printed wiring board from warping in a reflow process for mounting an electronic component.

A combined wiring board according to an embodiment of the present invention is structured to have multiple wiring boards and a metal frame that includes an opening to accommodate the multiple wiring boards. The multiple wiring boards are connected to each other by an adhesive agent and then being fixed to the opening.

In a combined wiring board according to an embodiment of the present invention, since wiring boards are connected to each other and then accommodated into a metal frame and fixed to the frame, warping is unlikely to occur in each wiring board. Moreover, an efficient process is achieved for connecting each wiring board to the metal frame. Especially, fixing wiring boards to the frame while they are connected to each other by an adhesive agent reduces variations in warping caused by the positional difference of each wiring board in the combined wiring board (for example, a position at an edge or in the center). Thus, compared with a structure where each wiring board is individually fixed to a metal frame, differences in the effects of warping reduction are minimized. In addition, the number of wiring boards in a combined wiring board is easily adjusted by changing the number of connected wiring boards.

Obviously, numerous modifications and variations of the present invention are possible in light of the above teachings. It is therefore to be understood that within the scope of the appended claims, the invention may be practiced otherwise than as specifically described herein.

What is claimed is:

1. A combined wiring board, comprising: a wiring board set comprising a plurality of wiring boards and at least one adhesive agent portion such that the wiring boards are connected each other by the adhesive agent portion;

and a metal frame having an accommodation opening portion configured to accommodate the wiring board set such that the wiring board set is positioned in the accommodation opening portion of the metal frame, wherein the metal frame has a coefficient of thermal expansion which is higher than a coefficient of thermal expansion of the wiring board set with respect to a direction of a main surface of the metal frame and a direction of a main surface of the wiring board set.

2. A combined wiring board according to claim 1, wherein the metal frame has a plurality of crimped portions plastically deformed such that wall portions of the metal frame in the accommodation opening portion are in contact with side wall portions of the wiring board set to fix the wiring board set in the accommodation opening portion of the metal frame.

3. A combined wiring board according to claim 2, wherein the metal frame has a plurality of slit portions formed in the accommodation opening portion, and the wiring board set has a plurality of support piece portions configured to engage with the plurality of slit portions, respectively.

4. A combined wiring board according to claim 2, wherein the metal frame has a plurality of slit portions formed in the accommodation opening portion, the wiring board set has a plurality of support piece portions configured to engage with the plurality of slit portions, respectively, and the plurality of crimped portions are formed adjacent to the plurality of slit portions.

5. A combined wiring board according to claim 2, wherein the metal frame has a plurality of slit portions formed in the accommodation opening portion, and the wiring board set has a plurality of support piece portions formed on each of the wiring boards such that the plurality of support piece portions is configured to engage with the plurality of slit portions, respectively.

6. A combined wiring board according to claim 2, wherein the metal frame has a plurality of slit portions formed in the accommodation opening portion, the wiring board set has a plurality of support piece portions formed on each of the wiring boards such that the plurality of support piece portions is configured to engage with the plurality of slit portions, respectively, and the plurality of crimped portions are formed adjacent to the plurality of slit portions.

7. A combined wiring board according to claim 1, wherein the metal frame has a plurality of slit portions formed in the accommodation opening portion, and the wiring board set has a plurality of support piece portions configured to engage with the plurality of slit portions, respectively.

8. A combined wiring board according to claim 1, wherein the plurality of wiring boards in the wiring board set has a plurality of coupling portions configured to engage each other such that the printed wiring boards are connected each other.

9. A combined wiring board according to claim 1, wherein the metal frame has a thickness which is less than a thickness of each of the wiring boards.

10. A combined wiring board according to claim 1, wherein the accommodation opening portion of the metal frame is configured such that a clearance is formed between the metal frame and the wiring board set accommodated in the accommodation opening portion of the metal frame.

11. A combined wiring board according to claim 1, wherein the metal frame has a plurality of alignment holes.

12. A method for manufacturing a combined wiring board, comprising: preparing a wiring board set comprising a plurality of wiring boards and at least one adhesive agent portion connecting the wiring boards each other;

accommodating the wiring board set in an accommodation opening portion formed in a metal frame such that the wiring board set is positioned in the accommodation opening portion of the metal frame; and fixing the wiring board set positioned in the accommodation opening portion of the metal frame to the metal frame, wherein the preparing of the wiring board set includes forming the adhesive portion between the wiring boards such that the wiring boards are adhered and connected by the adhesive agent portion to form the wiring board set.

13. A method for manufacturing a combined wiring board according to claim 12, wherein the preparing of the wiring board set includes aligning the wiring boards with a plurality of alignment members and forming the adhesive agent portion between the wiring boards aligned by the alignment members such that the wiring boards are adhered and connected by the adhesive agent portion to form the wiring board set.

14. A method for manufacturing a combined wiring board according to claim 12, further comprising:

crimping a plurality of portions of the metal frame such that a plurality of crimped portions plastically deformed is formed in the metal frame and wall portions of the metal frame in the accommodation opening portion bond to side wall portions of the wiring board set to fix the wiring board set in the accommodation opening portion of the metal frame.

15. A method for manufacturing a combined wiring board according to claim 12, wherein the accommodating of the wiring board set includes engaging a plurality of support piece portions formed on the wiring board set with a plurality of slit portions formed in the metal frame inside the accommodation opening portion of the metal frame, respectively.

* * * * *